(12) United States Patent
Denes et al.

(10) Patent No.: US 7,901,744 B2
(45) Date of Patent: Mar. 8, 2011

(54) RF PLASMA-ENHANCED DEPOSITION OF FLUORINATED FILMS

(75) Inventors: Ferencz S. Denes, Madison, WI (US); Sorin O. Manolache, Madison, WI (US); Luis Emilio Cruz-Barba, Guadalajara (MX); Max G. Lagally, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 119 days.

(21) Appl. No.: 12/271,575

(22) Filed: Nov. 14, 2008

(65) Prior Publication Data

US 2009/0123639 A1 May 14, 2009

Related U.S. Application Data

(62) Division of application No. 11/338,437, filed on Jan. 24, 2006, now abandoned.

(51) Int. Cl.
*H05H 1/24* (2006.01)
(52) U.S. Cl. ...................................... 427/569
(58) Field of Classification Search .................. None
See application file for complete search history.

(56) References Cited

U.S. PATENT DOCUMENTS

| | | | |
|---|---|---|---|
| 4,718,907 A | 1/1988 | Karwoski et al. | |
| 5,034,265 A | 7/1991 | Hoffman et al. | |
| 5,244,730 A | 9/1993 | Nguyen et al. | |
| 5,336,518 A | 8/1994 | Narayanan et al. | |
| 5,876,753 A | 3/1999 | Timmons et al. | |
| 5,888,591 A | * 3/1999 | Gleason et al. | 427/522 |
| 6,602,287 B1 | 8/2003 | Millare et al. | |
| 7,283,228 B2 | 10/2007 | Zhang et al. | |
| 2002/0120326 A1 | 8/2002 | Michal | |
| 2008/0138626 A1 | 6/2008 | Denes et al. | |

OTHER PUBLICATIONS

V. Panchalingam et al., "Molecular surface tailoring of biomaterials via pulsed RF plasma discharges," *Journal of Biomaterials Science, Polymer Edition*, vol. 5, No. 1/2, pp. 131-145, 1993.
International Search Report for PCT/US2007/060969, mailed May 14, 2008.
Written Opinion for PCT/US2007/060969, mailed May 14, 2008.
Page print of http://www.polymerprocessing.com/operations/spcoat/ , "Spin Coating", dated Dec. 7, 2005.

* cited by examiner

*Primary Examiner* — Timothy H Meeks
*Assistant Examiner* — Joseph Miller, Jr.
(74) *Attorney, Agent, or Firm* — Bell & Manning, LLC

(57) ABSTRACT

Low- or atmospheric pressure RF plasma-enhanced thin film deposition methods are provided for the deposition of hydrophobic fluorinated thin films onto various substrates. The methods include at least two steps. In the first step, RF plasma-mediated deposition is used to deposit a fluorinated film onto a substrate surface. In a second step, plasma-generated active sites on the fluorinated film are quenched by reacting them with stable fluorinated gas-phase molecules in situ, in the absence of plasma, to provide a hydrophobic fluorinated thin film having a very low oxygen content. In some instances the hydrophobic fluorinated thin films have an atomic oxygen concentration of no more than about 3%.

22 Claims, 4 Drawing Sheets

RF PLASMA-ENHANCED DEPOSITION OF FLUORINATED FILMS

REFERENCE TO RELATED APPLICATION

This application is a divisional of U.S. patent application Ser. No. 11/338,437, filed Jan. 24, 2006, the disclosure of which is incorporated herein by reference in its entirety.

STATEMENT OF GOVERNMENT RIGHTS

Research funding was provided for this invention by the Office of Naval Research (ONR) under Grant Number N00014-02-1-0893. The United States government has certain rights in this invention.

FIELD OF THE INVENTION

This invention pertains generally to the radiofrequency (RF) plasma enhanced deposition of fluorinated thin films.

BACKGROUND OF THE INVENTION

Use of low fluorescence background (LFB) substrates for Raman Spectroscopy investigations is crucial for the generation of high-resolution Raman spectra. Equally significant is the fact that the LFB substrates should exhibit an advanced hydrophobic character that eliminates the spread of the deposited analyte-spots and renders as a result small (concentrated) analyte surface areas. LFB is also a concern for bio-sensor and large surface area bio-array applications where the desired molecular recognition sites, the ordered spots of the network, should not "communicate" and should retain their individual reactive specificities.

Hydrophobic, low-friction substrates are also crucial for certain applications. For example, catheter guiding wires have to exhibit inert surface characteristics and should have a low surface energy in order to avoid the development of friction forces between the inner surfaces of the catheters and the surfaces of the metal guiding wire during the insertion of the catheter in a living tissue environment, positioning of stents, etc. Current guiding wire surfaces often exhibit rough and non-lubricious surface characteristics. Coating wire surfaces with an inert, highly fluorinated (Teflon-like) thin layer could significantly enhance all operations and safety issues related to the insertion of bioactive devices into "in vivo" environments.

It is known that LFB and very hydrophobic substrates can be produced by the deposition of Teflon or Teflon-like layers using conventional, immersion, spin-coating and spraying technologies. However, Teflon is not soluble in any solvents and modified poly-tetrafluoroethylene macromolecular chains are shy on certain desirable Teflon characteristics, including thermal stability and hydrophobic character. Adhesion of Teflon particles suspended in organic and inorganic media and Teflon-like materials dissolved in organic solvents is often not satisfactory due to the inert nature of the perfluorinated macromolecular chains that create poor adhesion characteristics of the deposited layers.

An alternative approach for the deposition of highly fluorinated organic macromolecular thin layers onto inorganic and organic substrate surfaces is offered by cold-plasma reaction mechanisms. By starting from various fluorinated olefin and paraffin volatile derivatives Teflon-like thin layers may be deposited onto various substrates using plasma deposition techniques. However, the presence of plasma-generated, omnipresent, free radical sites located on the plasma-coated surfaces and generated as a result of the interaction of plasma species with the "nascent" macromolecular thin-layers induce, under open laboratory conditions, oxidation reactions with the formation of polar functionalities. These oxygen containing groups increase the surface energy of the deposited layers and generate reactive surfaces, which significantly reduce the efficiency of the molecular recognition process.

SUMMARY OF THE INVENTION

Low- or atmospheric pressure RF plasma-enhanced thin film deposition methods are provided for the deposition of hydrophobic fluorinated thin films onto various substrates. The methods include at least two steps. In the first step, RF plasma-mediated deposition is used to deposit a fluorinated film onto a substrate surface. In a second step, plasma-generated active sites on the fluorinated film are quenched by reacting them with stable fluorinated gas-phase molecules in situ, in the absence of plasma, to provide a hydrophobic fluorinated thin film having very low oxygen content. In some instances the hydrophobic fluorinated thin films have an atomic oxygen concentration of no more than about 3%.

The fluorinated films deposited using the methods provided herein may be fabricated with lower oxygen content than similar surfaces fabricated using other plasma-mediated deposition techniques that lack an in situ active site quenching step. In addition, unlike similar surfaces made using spin coating techniques, the fluorinated films are strongly bound to the surface. The fluorinated films are hydrophobic and provide very low fluorescence background.

The fluorinated films provided herein are well suited for use as coatings in chemical and biochemical sensors where low fluorescence background is important. Such sensors include biochips and biosensors, including flexible, thin-film biosensors that can be integrated into traditional microelectronics and used in fluorescence assays. The fluorinated films are also well suited for use as coatings on implantable medical devices where low friction, hydrophobic surfaces are important. For example, the coatings may be applied to catheter guide wires to prevent sticking of the guide wires to the catheter surface.

In a first step of the methods provided herein, the surface of a substrate is exposed to a plasma of fluorine-containing fragment molecules generated from fluorinated precursor molecules under conditions that promote the deposition of a crosslinked fluorinated film on the surface of the substrate. In a subsequent step, plasma generated active sites (e.g., ion and free radicals) on the surface are reacted with molecules of a fluorinated quenching molecule (which may or may not be same as the fluorinated precursor molecule used to generate the fluorine-containing fragment molecules) in situ, in the absence of plasma, to quench the surface active sites and prevent or minimize surface oxidation.

The methods provided herein may be used to coat the surfaces of a broad range of organic and inorganic substrates. The methods are particularly well-suited for use with inorganic substrates, including, but not limited to, metal substrates (e.g., stainless steel), silica, quartz, glass, and metal-coated substrates (e.g., gold-coated substrates).

Further objects, features and advantages of the invention will be apparent from the following detailed description when taken in conjunction with the accompanying drawings.

DETAILED DESCRIPTION

Figure 1:
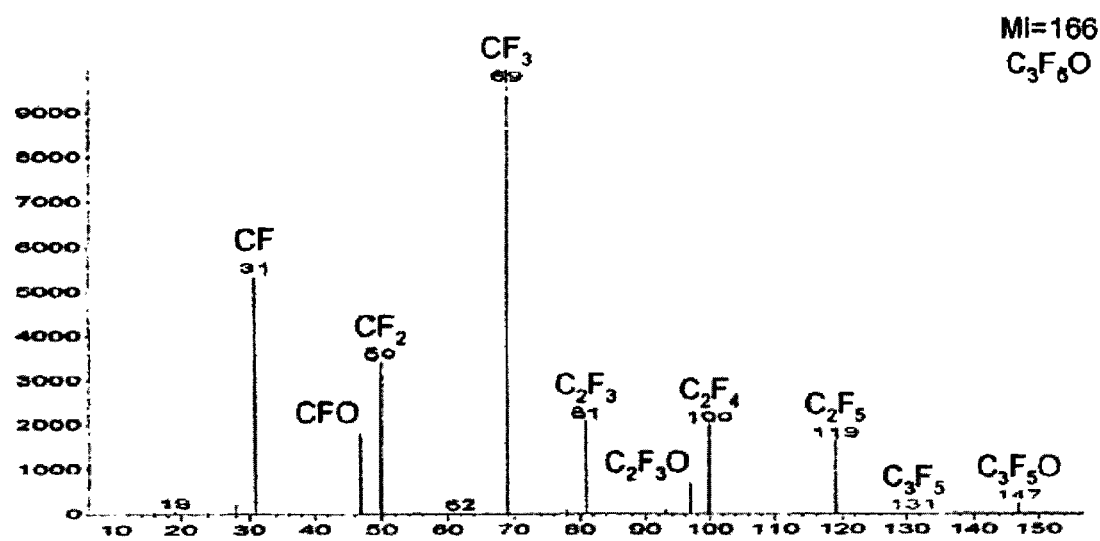
FIG. 1 shows the electron-impact fragmentation pattern for hexafluoropropylene oxide.

Plasma-enhanced, in situ surface coating processes for the production of fluorinated thin surface layers having very low surface oxygen contents are provided. The processes eliminate or minimize plasma-produced, high reactivity surface species prior to exposing the surface film to ambient oxygen, thereby eliminating or minimizing surface oxidation. During an initial step of the processes, RF plasma-mediated deposition is used to deposit a fluorinated film onto a substrate surface. In a subsequent step, the film is reacted with stable reactive (e.g. vinyl) fluorine-containing gas molecules in the absence of plasma in order to quench reactive species ("active sites") that are generated during the plasma-mediated deposition.

In accordance with the methods provided herein, fluorinated film deposition begins by subjecting fluorinated precursor molecules to a RF plasma discharge to produce fluorine-containing fragment molecules which react with a substrate to form a crosslinked fluorinated surface layer on the substrate. The precursor molecules may be introduced into the plasma chamber as a precursor gas with or without a carrier gas (e.g. $H_2$). The selection of appropriate plasma parameters for the creation of a fluorinated film on a substrate may depend on the specific design of the reactor and on the relative geometric positioning of the substrate in the reactor chamber. The non-equilibrium plasma is generally a low-pressure plasma, although atmospheric pressure plasmas may also be employed. Typical reactor conditions include pulsed plasma conditions with a power of about 50-200 Watts, a period of about 800 microseconds-1000 milliseconds, duty cycle of about 10-50%, and pressure of 50-1000 m Torr. However, reactor conditions outside these ranges may also be employed. Generally, a fluorinated thin film may be deposited in a relative short time (e.g., 1 to 20 minutes or less).

A variety of molecules may be used as the fluorinated precursor molecules. Typically, the precursor molecules will be fluorinated hydrocarbon molecules Low molecular weight perfluorohydrocarbons are particularly desirable, including, but not limited to, $C_1$-$C_{10}$ (e.g., $C_1$-$C_6$) perfluorohydrocarbons. Examples of per fluorohydrocarbons include straight-chain or cyclic perfluoroolefins, perfluoroalkanes, perfluoroalkenes, perfluoroalkynes, perfluorocycloalkanes, perfluorocycloalkenes and perfluorocycloalkynes. The precursor molecules are desirably selected such that they do not produce significant amounts of oxygen-containing fragment molecules. In addition, it may be desirable to select fluorinated precursor molecules that generate predominantly fluorine-containing fragment molecules that tend to form crosslinked, continuous film structures. For example, $CF_3$ species do not generally form a continuous film structure and, as a result, tend to provide fluorinated films with diminished hydrophobic surface characteristics. Higher molecular weight fragment molecules (e.g., $C_2F_4$ and $C_2F_5$), in contrast, provide a more hydrophobic crosslinked film.

Figure 2:
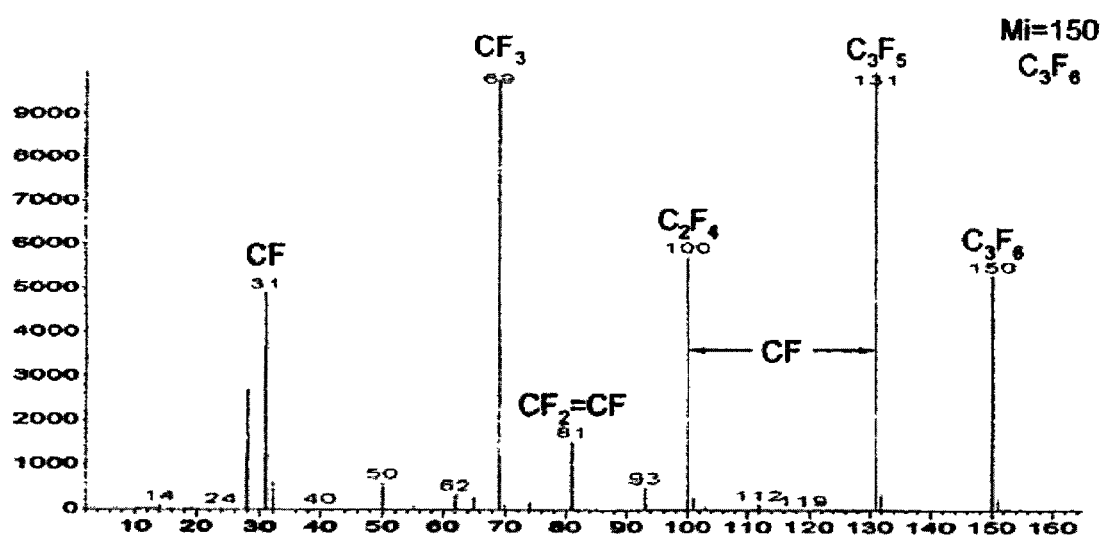
FIG. 2 shows the electron-impact fragmentation pattern for hexafluoropropene.

Based on the inventors' observation that mass spectroscopic electron impact induced molecular fragmentation patterns and non-equilibrium plasma-induced molecular fragmentation patterns are similar, suitable precursor molecules may be selected by choosing a precursor molecule that has an electron impact induced molecular fragmentation pattern similar to the desired plasma induced molecular fragmentation pattern. By selecting those precursor molecules that result in a limited number of dominant charged and neutral (i.e., free radical) species, the chemical nature of the plasma-deposited nascent macromolecular layers can be predicted. Using this approach, the inventors have identified hexafluoropropylene oxide (HFPO) and hexafluoropropylene (HFPP) as two precursor molecules that are well suited for use in the RF plasma-mediated deposition of hydrophobic fluorinated thin films. The structures and electron-impact fragmentation patterns for both of these molecules are shown in FIGS. 1 and 2, respectively. As shown in the electron-impact fragmentation pattern of FIG. 1, HFPO produces only small amounts of oxygen-containing species which include, $m_z$=47 amu (CF—$O^+$), $m_z$=97 amu ($CF_2$=O—$CF^+$, fluorinated oxirane cation) and $m_z$=147 amu ($C_3F_5O$) in comparison to the carbon- and fluorine-containing species. As shown in FIG. 2, the electron-impact fragmentation of HFPP produces a higher proportion of higher molecular weight molecular fragments than does HFPP. In addition to $CF_3^+$ ($m_z$=69 amu), substantial quantities of $C_2F_4^+$ ($m_z$=100 amu) and $C_3F_5^+$ ($m_z$=131 amu) cation molecular fragments are produced. Because the incorporation of even small amounts of oxygen-based chemical bonds resulting from either the precursor molecule structure or the uptake of oxygen in open laboratory conditions may significantly influence the surface energy and fluorescence background of the fluorinated film, HFPP may be a preferred precursor molecule in applications where maximum hydrophobicity and minimum fluorescence background are desirable.

Once the fluorinated film with surface active sites has been generated on the substrate surface by plasma-treatment; the active sites are reacted with a gas of fluorinated quenching molecules in the absence of plasma. This may be accomplished by exposing the fluorinated film to the gas in situ, that is, without first breaking the vacuum in the plasma reactor chamber or otherwise exposing the surface to oxygen in the atmosphere. If the active sites on the surface are exposed to atmosphere before being exposed to the fluorinated quenching molecules, they will react with oxygen in the atmosphere, producing a less hydrophobic surface with a higher fluorescence background. Typically, the plasma reactor chamber is pumped down after the plasma-mediated deposition of the fluorinated film and, without breaking the vacuum; the fluorinated quenching molecules are introduced into the chamber. The necessary exposure time is typically quite short. In some embodiments, the active sites are exposed to the gas for no more than about 30 minutes. This includes embodiments where the active sites are exposed to the gas for no more than about 20 minutes and further includes embodiments where the active sites are exposed to the gas for no more than about 10 minutes.

The fluorinated quenching molecules that react with the active sites on the fluorinated film may be the same as or different from the fluorinated precursor molecules used to produce the fluorine-containing molecular fragments used in the preceding plasma-treatment step.

The fluorinated films made in accordance with the present methods may be very thin. For example, the films may have a thickness of no greater than about 1 µm. Typically, the films will have a thickness of about 200 to about 700 nm. However, films having thicknesses outside of these ranges may be produced.

The fluorinated films are characterized by high fluorine contents and very low oxygen contents. For example, the fluorinated films may have a fluorine content of at least about 50 atomic percent. This includes films having a fluorine content of at least about 55 atomic percent and further includes films having a fluorine content of at least about 60 atomic percent (e.g., 60 to 65 atomic percent). The films may be produced with an oxygen content of no more than about 3 atomic percent. This includes films having an oxygen content of no more than about 1 atomic percent and further includes films having an oxygen content of no more than about 0.5 atomic percent.

The fluorinated films are typically very hydrophobic. The hydrophobic nature of the crosslinked films may be reflected in their high $CF_3$ content, relative to their $CF_2$ content. The ratio of the $CF_3$ to $CF_2$ content of the fluorinated films is reflected in their C to F (C/F) ratio, which may be measured by electron spectroscopy for chemical analysis (ESCA). (The description of an ESCA system that may be used to provide C/F measurements is described in the Examples, below.) However, the low friction, low fluorescence-background films may also have relatively high C/F ratios. For example, in some embodiments, the present fluorinated films may have a C/F ratio of at least about 0.6 as measured by ESCA. This includes films having a C/F ratio of at least about 0.7, and further includes films having a C/F ratio of at least about 0.8. For example, the films may have a C/F ratio of about 0.6 to about 0.7, or a C/F ratio of about 0.7 to 0.8.

The hydrophobic nature of the films is also reflected in the high water contact angles provided by the films. For example, some of the fluorinated films may have a water contact angle of at least about 100 degrees. This includes films having water contact angles of at least about 110 degrees, further includes films having water contact angles of at least about 115 degrees and still further includes films having water contact angles of at least about 120 degrees.

The plasma-mediated deposition process results in a fluorinated film that is strongly bonded to the underlying substrate. The present fluorinated films are not spin coatings and, as such, are not easily peeled away from the substrate, even in the presence of reactive chemicals, such as acetonitrile. For example, in some embodiments, the fluorinated films will not delaminate from a substrate upon sonication in water or acetonitrile for periods of at least 5 minutes.

The fluorinated films of the present invention are well-suited for use in a variety of applications. For example, substrates coated in the fluorinated films may be used in chemical and biochemical sensors. The films exhibit low non-specific adsorption and are non-reactive toward most biomolecules, making them particularly well-suited for use in biosensors. In these biosensors, one or more biomolecules are attached to the coated substrate. The attached biomolecules are selected such that they undergo a binding interaction with, or hybridize with, an analyte biomolecule. The sensor is then exposed to a sample containing, or suspected of containing, the analyte and the presence or absence of the analyte is detected (e.g., fluorescence detection using fluorescently labeled biomolecules). A variety of biomolecules may be attached to the surface or identified as analytes. These biomolecules include, but are not limited to, oligonucleotides, DNA, RNA, proteins, enzymes, and antibodies. The biosensors may employ patterned or non-patterned surfaces. In some embodiments the biosensors are electronic biosensors, wherein the biomolecules are attached to the coated substrates in an array and different areas of the array are electronically addressable to provide for electronic detection. Inorganic substrates that may be used in the sensors include, metal substrates, metal oxide substrates, glass substrates and silica substrates. Alternatively, polymer substrates could be employed.

Another important application for the fluorinated films of the present invention are device coatings, and in particular medical device coatings. The inert, low friction fluorinated films make them particularly well-suited for medical device and implant applications where low friction is important. The coatings may be particularly useful for coating metal (e.g., stainless steel) medical devices or implants. For example, the fluorinated films may be used to coat the surfaces of catheter guiding wires for stents to prevent sticking between the surface of the guiding wires and the stents. The coatings are also useful on medical implants, including prostheses and the hardware associated with prostheses, (e.g., bone screws, pins, plates) and guide rods, and syringes.

The fluorinated films may also be used as coating on low dimension fluid handling devices, or microfluidic devices, including MEMS, lab-on-a-chip applications, and the like. The films are well-suited for such applications since compatibilization of surface energies of various components of micro-systems is crucial for flow control. In addition, the chemical inertness of the fluorinated film-coated surfaces in contact with biological fluids may help to minimize or prevent the development of undesired chemical reactions and potential deactivation of biological molecules.

A variety of configurations of inductively or capacitively coupled non-equilibrium, low pressure plasma reactors can be adapted for the production of the fluorinated films. An example of a preferred parallel plate reactor provided with temperature control capabilities that can be utilized for plasma treatment in accordance with the invention is shown at 20 in FIG. 3. The reactor 20 is provided with heating capabilities (in the range of 25-500° C.) for the reaction chamber. The reactor is composed of a cylindrical stainless steel reaction chamber 21 in which a 20 cm diameter and a 0.8 cm thick lower, grounded electrode 22 and an (identical dimensions) upper, stainless steel electrode 23 are located. The upper electrode 23 is connected to a conventional RF-power supply 25. Conventional power supplies are available at 40 kHz and 13.56 MHz (operable continuous (CW) or pulsed). Typically, the MHz and kHz power supplies are separate units. Both electrodes are preferably removable, which facilitates post-plasma cleaning operations. The lower electrode 22 is also a part of the vacuum line 26 through supporting conically shaped and circularly-perforated stainless steel tubing. The evacuation of the chamber 21 is performed uniformly through the narrow gap (3 mm) existing between the lower electrode 22 and the bottom of the reaction chamber. The upper electrode 23 is directly connected to the threaded end of a vacuum-tight metal/ceramic feedthrough 29 which assures both the insulation of the RF-power line from the reactor and the dissipation of the RF-power to the electrodes. The space between the upper electrode and the upper wall 30 of the reaction chamber is occupied by three 1 cm thick and 20 cm diameter Pyrex-glass removable disks 31. These discs insulate the electrode from the stainless steel top of the reactor and allow adjustment of the electrode to electrode gap. The reactor volume located outside of the perimeter of the electrodes is occupied by two Pyrex-glass cylinders 33 provided with four symmetrically located through-holes 34 for diagnostic purposes. This reactor configuration substantially eliminates the non-plasma zones of the gas environment and reduces considerably the radial diffusion of the plasma species, leading consequently to a more uniform plasma-exposure of the substrates being treated. As a result, uniform surface treatments can be achieved. The removable top of the reactor allows the reaction chamber to be vacuum sealed with the aid of a copper gasket and fastening bolts 35. This part of the reactor also accommodates a narrow circular gas-mixing chamber 36 provided with a shower-type, 0.5 mm diameter orifices system, and with a gas supply connection 37. This gas supply configuration assures a uniform penetration and flow of the gases and vapors through the reaction zone. The entire reactor chamber can be heated with electric heaters 38 attached to the outside surface of the chamber. The reactor chamber is enclosed in an aluminum-sheet 39 which protects a glass-wool blanket 40 that surrounds the sides of the reactor chamber to reduce thermal energy loss. Four symmetrically positioned stainless steel porthole tubes pass through the insulating blanket and are connected and welded to the reactor wall for diagnostic purposes. These portholes are provided with exchangeable, optically smooth, quartz windows 42.

Figures 3, 4:
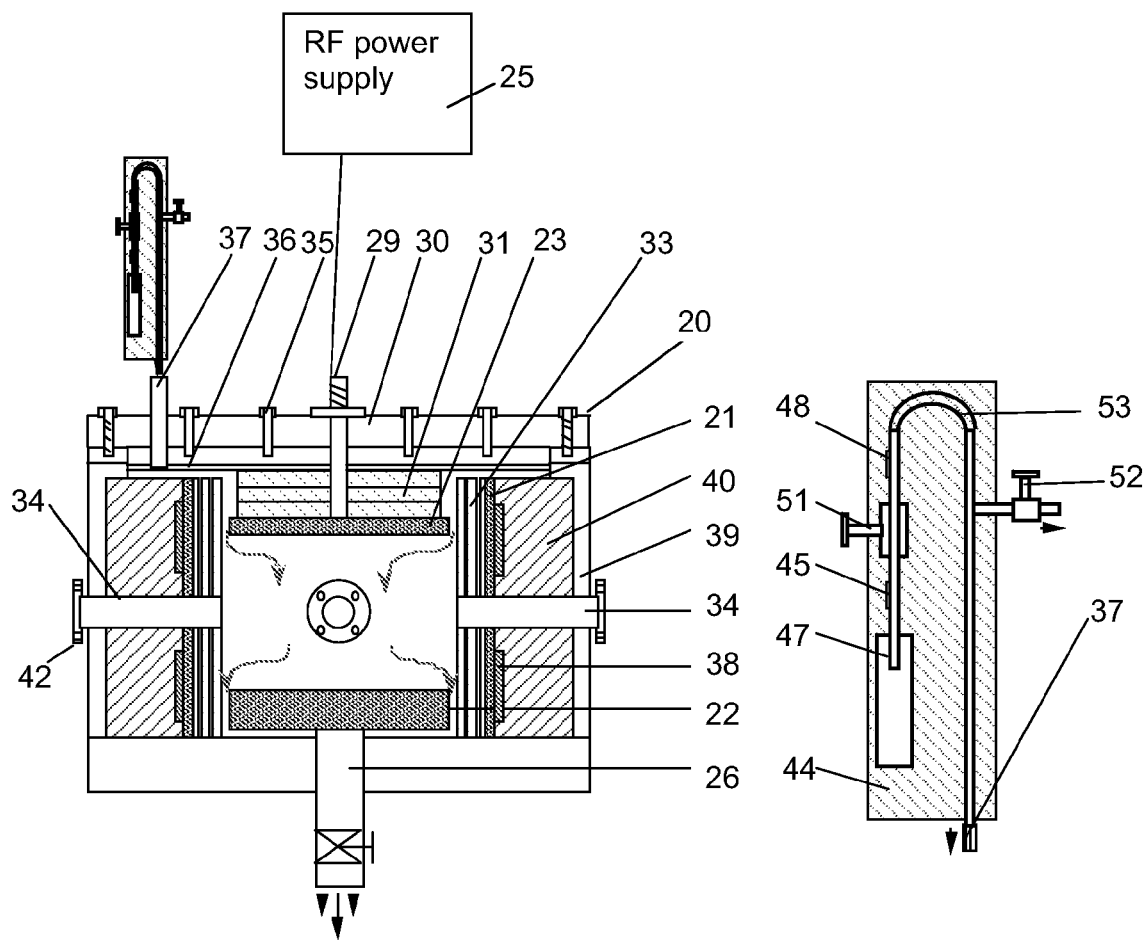
FIG. 3 is a schematic diagram of a parallel plate plasma reactor that may be used to carry out the present methods.
FIG. 4 is a schematic diagram the gas reservoir, valve and tubing of the plasma reactor of FIG. 3.

The gas reservoir, valve and the connecting stainless steel tubing are shown in greater detail in FIG. 4 and, as shown, are embedded in two shape-designed, 1 cm thick copper jackets 44 provided with controlled electric heaters 45. The vapor supply assemblage is composed of a reservoir 47, VCR connectors 48, needle valves 51 and 52, and connecting tubing 53. The entire system is insulated using a glass-wool blanket coating.

The reactor 20 thus may be utilized to control the temperature of the reactor chamber and the substrate to achieve desired plasma operating conditions. Inductively coupled plasma reactors and other closed reactors may be utilized as well as corona discharge devices, examples of which are discussed below.

Figure 5:
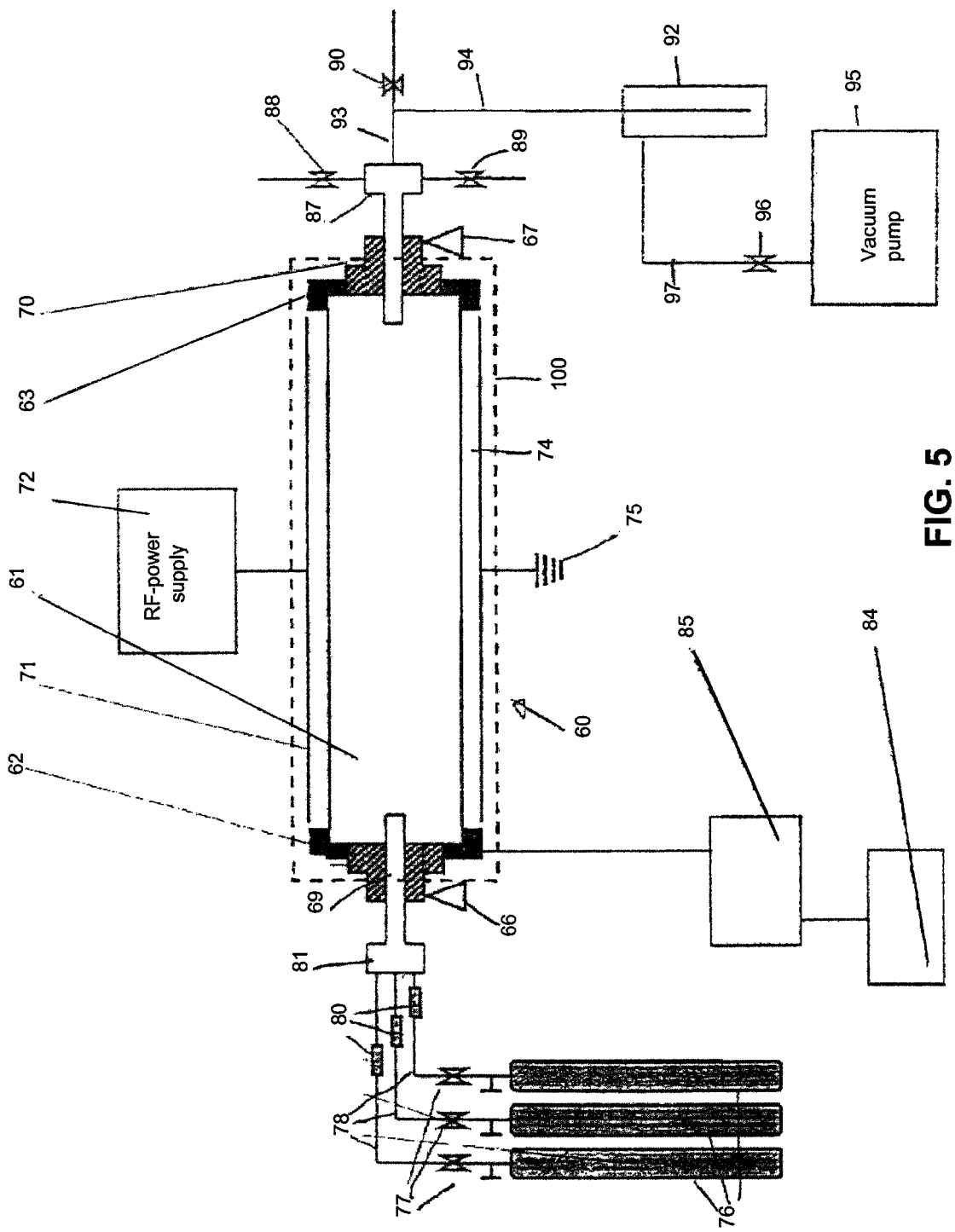
FIG. 5 is a schematic diagram of a rotary plasma reactor that may be used to carry out the present methods.

An example of a cold plasma rotary reactor system which may be utilized to carry out the invention is shown in FIG. 5 at 60. Such a rotary system is especially well suited to the plasma treatment of fibers, powders and other particulate matter. The reactor system includes a cylindrical reaction vessel 61 (e.g., formed of Pyrex® glass, 1 m long and 10 cm inside diameter) which is closed at its two ends by disk-shaped stainless steel sealing assemblies 62 and 63. The end assemblies 62 and 63 are mounted to mechanical support bearings 66 and 67 which engage the sealing assemblies 62 and 63 to enable rotation of the reaction vessel 61 about its central axis, i.e., the central axis of the cylindrical reaction vessel. Hollow shaft (e.g., 0.5" inside diameter) ferrofluidic feedthroughs 69 and 70 extend through the sealing assemblies 62 and 63, respectively, to enable introduction of gas into and exit of gas from the reaction chamber. A semi cylindrical, outside located, copper upper electrode 71 is connected to an RF power supply 72, and a lower, similar semi cylindrical copper electrode 74 is connected to ground (illustrated at 75). The two electrodes 71 and 74 closely conform to the cylindrical exterior of the reaction vessel 61 and are spaced slightly from the inner wall, and together extend over most of the outer periphery of the reaction vessel but are spaced from each other at their edges a sufficient distance to prevent arcing or discharge between the two electrodes.

The precursor gas is held in containers 76, e.g., storage tanks. The flow of gas from a precursor containing 76 is controlled by needle valves and pressure regulators 77 which may be manually or automatically operated. The gas that passes through the control valves 77 is conveyed along supply lines 78 through flow rate controllers 80 to a gas mixing chamber 81 (e.g., preferably of stainless steel), and an MKS pressure gauge (e.g., Baratron) may be connected to the mixing chamber 81 to monitor the pressure thereof. The mixing chamber 81 is connected to the feedthrough 69 that leads into the interior of the reaction chamber 61. A digital controller 84 controls a driver motor 85 that is connected to the assembly 62 to provide controlled driving of the reaction chamber in rotation.

The second feedthrough 70 is connected to an exhaust chamber 87 to which are connected selectively openable exhaust valves 88, 89 and 90, which may be connected to conduits for exhaust to the atmosphere or to appropriate recovery systems or other disposal routes of the exhaust gases. A liquid nitrogen trap 92 is connected to an exhaust line 93 which extends from the chamber 87 by stainless steel tubing 94. The trap 92 may be formed, e.g., of stainless steel (25 mm inside diameter). A mechanical pump 95 is connected through a large cross-section valve 96 via a tube 97 to the trap 92 to selectively provide vacuum draw on the reactor system to evacuate the interior of the reaction chamber 61 to a selected level.

The power supply 72 is preferably an RF power supply (e.g., 13.56 MHz, 1,000 W) which, when activated, provides RF power between the electrodes 71 and 74 to capacitively couple RF power to the precursor gas in the reaction chamber within the reaction vessel 61. Conventional coils for inductively coupling RF power to the plasma may also be used (e.g., a coil extending around the reaction vessel 61). A Faraday cage 100 is preferably mounted around the exterior of the reaction vessel to provide RF shielding and to prevent accidental physical contact with the electrodes.

The reactor vessel may be rotated by the drive motor 85 at various selected rotational speeds (e.g., 30-200 rpm), and it is preferred that the vacuum pump and associated connections allow the pressure in the reaction chamber within the vessel to be selectively reduced down to 30 mTorr.

The following are examples of commercial parts that may be incorporated in the system 60: RF-power supply 85 (Plasma Therm Inc. RTE 73, Kresson N.J. 08053; AMNS-3000 E; AMNPS-1); mechanical vacuum pump 95 (Leibold-Heraeus/Vacuum Prod. Inc., Model: D30AC, Spectra Vac Inc); pressure gauge (MKS Baratron, Model: 622A01TAE); digitally controlled rotating system 84, 85 (DC motor Model 4Z528, Dayton Electric Mfg. Co.; DART Controls Inc. controller).

In utilization of the plasma treatment system 60 in accordance with the invention, it is generally preferred to carry out a plasma-enhanced cleaning of the reactor prior to treatment to eliminate possible contaminants. An exemplary cleaning step includes introduction of oxygen gas from one of the tanks 76 into the reaction chamber and ignition of the plasma at, e.g., a power of 300 W, gas pressure of 250 mTorr, oxygen flow rate of 6 sccm, and a typical cleaning period of 15 minutes.

The methods provided herein may be used to provide hydrophobic, low fluorescence background films on a variety of substrates. Suitable substrates include both organic and inorganic substrates. Specific examples of such substrates include, but are not limited to, metal substrates (e.g., polished stainless steel, metal wires, metal nanoparticles and gold coated substrates), glass substrates (e.g., glass, quartz and silicon substrates), carbon substrates (e.g., diamond, diamond-like carbon, graphite and carbon nanoparticle substrates) and polymer substrates.

Exemplary embodiments of the present methods for the production of fluorinated thin films are provided in the following examples. These examples are presented to illustrate the methods and to assist one of ordinary skill and using the same. These examples are not intended in any way to otherwise limit the scope of the invention.

EXAMPLES

Equipment and Surface Characterization

In each of the examples that follow, the RF plasma-mediated deposition of fluorinated thin films was carried out in a cylindrical stainless steel, capacitively coupled (disc-shaped stainless steel electrodes; electrode diameter: 20 cm; gap: 3 cm), RF-plasma-reactor, equipped with a 40 kHz power supply with pulsing capability, as shown in FIG. 3. The fluorinated thin films were deposited onto polished stainless steel substrates that had been previously cleaned using an oxygen and argon plasma surface polishing, as described above.

Electron spectroscopy for chemical analysis (ESCA) was used to evaluate the relative surface atomic compositions and the linkages located in non-equivalent atomic positions of substrate surface layers. Analysis were performed using a Perkin Elmer Physical Electronics 5400 small area ESCA system (Mg source; 15 kV; 300 W; 45° takeoff angle). In order to correct surface-charge-origin binding energy shifts, calibrations were performed based on the well-known $CF_2$ peak, which has a 292 eV binding energy.

Contact angle tests were performed by the projected sessile droplet method with deionized water (5 μL), using a Ramé-Hart NRL C. A. goniometer. A sustaining 60 seconds contact angle was measured.

Raman spectra were collected on a Nicolet Alarnega XR Micro-Raman system.

Example 1

Production of a Fluorinated Thin Film on a Stainless Steel Substrate Using HFPO as a Precursor Gas A fluorinated film was deposited on a stainless steel substrate using precursor molecules of HFPO. The RF plasma parameters during the initial plasma-mediated deposition step were as follows: 1) precursor gas pressure=200 Torr; 2) period=1000 msec; duty=30%; power=100 Watts; and plasma exposure time=5 minutes. The surface active sites on the resulting fluorinated film were quenched using a post-plasma environment of HFPO at a pressure of 1 Torr for about 30 minutes. ESCA analysis of the resulting hydrophobic fluorinated surface film revealed a carbon content of 38.5 atomic percent, a fluorine content of 60 atomic percent and an oxygen content of 1.5 atomic percent. The water contact angle on the hydrophobic surface film was 116°.

Example 2

Production of a Fluorinated Thin Film on a Stainless Steel Substrate Using HFPO as a Precursor Gas A fluorinated film was deposited on a stainless steel substrate using precursor molecules of HFPO. The RF plasma parameters during the initial plasma-mediated deposition step were as follows: 1) precursor gas pressure=200 Torr; 2) period=1000 msec; duty=15%; power=100 Watts; and plasma exposure time=5 minutes. The surface active sites on the resulting fluorinated film were quenched using a post-plasma environment of HFPO at a pressure of 1 Torr for about 30 minutes. ESCA analysis of the resulting hydrophobic fluorinated surface film revealed a carbon content of 37.3 atomic percent, a fluorine content of 61.3 atomic percent and an oxygen content of 1.4 atomic percent. The water contact angle on the hydrophobic surface film was 115°.

Example 3

Production of a Fluorinated Thin Film on a Stainless Steel Substrate Using HFPP as a Precursor Gas A fluorinated film was deposited on a stainless steel substrate using precursor molecules of HFPP. The RF plasma parameters during the initial plasma-mediated deposition step were as follows: 1) precursor gas pressure=200 Torr; 2) period=800 μsec; duty=30%; power=100 Watts; and plasma exposure time=5 minutes. The surface active sites on the resulting fluorinated film were quenched using a post-plasma environment of HFPP at a pressure of 1 Torr for about 30 minutes. ESCA analysis of the resulting hydrophobic fluorinated surface film revealed a carbon content of 41.7 atomic percent, a fluorine content of 57.5 atomic percent and an oxygen content of 0.8 atomic percent. The water contact angle on the hydrophobic surface film was 114°.

Example 4

Production of a Fluorinated Thin Film on a Stainless Steel Substrate Using HFPP as a Precursor Gas A fluorinated film was deposited on a stainless steel substrate using precursor molecules of HFPP. The RF plasma parameters during the initial plasma-mediated deposition step were as follows: 1) precursor gas pressure=1 Torr; 2) period=1000 msec; duty=30%; power=100 Watts; and plasma exposure time=5 minutes. The surface active sites on the resulting fluorinated film were quenched using a post-plasma environment of HFPP at a pressure of 1 Torr for about 30 minutes. ESCA analysis of the resulting hydrophobic fluorinated surface film revealed a carbon content of 39.1 atomic percent, a fluorine content of 57.9 atomic percent and an oxygen content of 3 atomic percent. The water contact angle on the hydrophobic surface film was 117°.

Example 5

Fluorescence Spectrum of Biomolecules on HFPO-Based Films

The low fluorescence background provided by the fluorinated films allows for high resolution detection of analytes on the films. This was demonstrated by exposing the fluorinated films made from HFPO, as described in Example 1, with fluorescently-tagged lysozyme at different concentrations and measuring the fluorescence signal from the surface using Raman spectroscopy (6 mW, 632.8 nm laser with 100 sec. integration and 100× objective). Raman spectra for two different concentrations of lysozyme were collected. For comparison, Raman spectra were collected from spin-coated substrates. The spin coating was applied by placing a solution of the perfluorohydrocarbon onto the substrate and rotating the substrate at high speed to spread the solution, with simultaneous solvent evaporation, until the desired film was produced. Substantially identical resolution was obtained from the plasma-coated and spin-coated samples.

Example 6

Fluorescence Spectrum of Biomolecules on HFPP-Based Films

Figure 6:
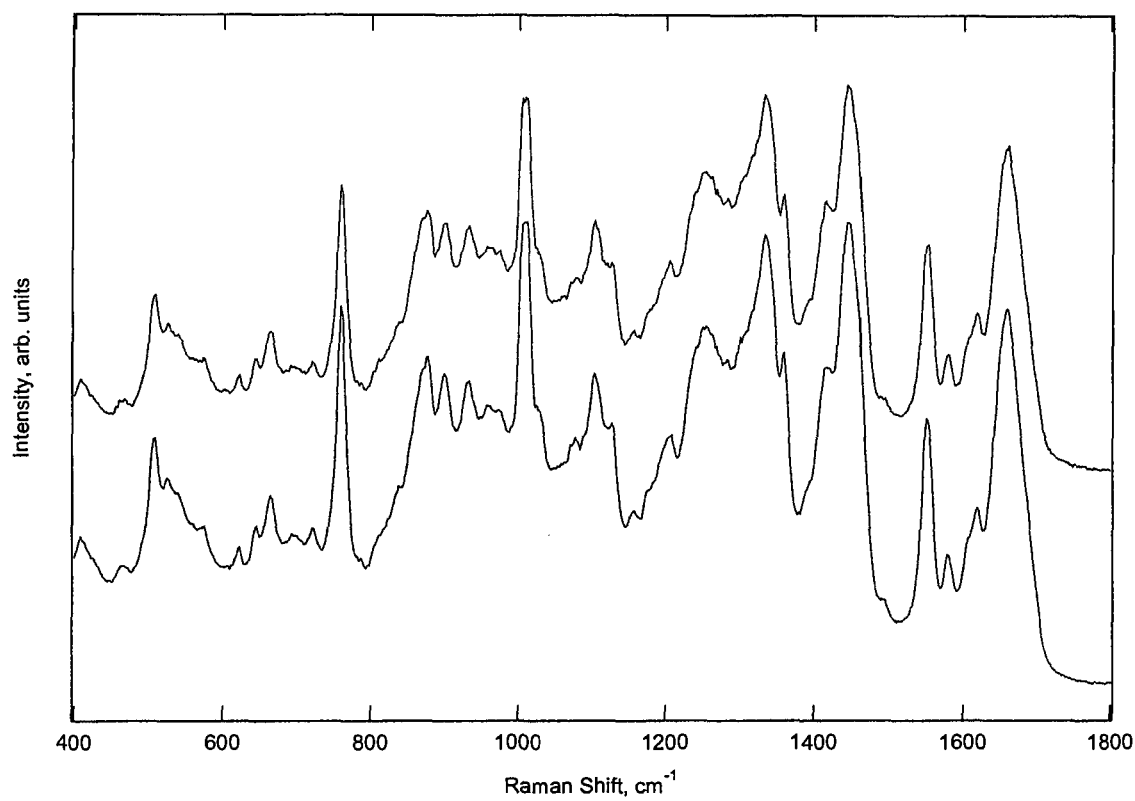
FIG. 6 shows the fluorescence Raman spectra for lysozymes on a HFPP-based fluorinated thin film made in accordance with the present methods and a fluorinated film made by spin-coating.

The experiment of Example 5 was repeated using the fluorinated films made from HFPP with the following parameters: 1) precursor gas pressure=200 mTorr; 2) period=1000 msec; duty=30%; power=100 Watts; and plasma exposure time=9 minutes total, divided in three steps consisting of 3 minutes of plasma followed by 10 minutes of post-plasma quenching in a 1 Torr HFPP atmosphere. FIG. 6 shows the Raman spectra taken from the plasma-coated sample (upper spectrum) and from a spin-coated sample (lower spectrum). As shown by the spectra, substantially identical resolution can be obtained from both samples.

Example 7

Delamination and Heat-Resistance Testing of HFPP-Based Films

The plasma-coated films are strongly bonded to their underlying substrates and resist delamination. This was demonstrated by sonicating the fluorinated film of Example 6 in water. The same experiment was run on a Spectrim™ substrate. (Spectrim™ is a stainless steel substrate that has been spin-coated with a thin layer of Teflon.) After 5 minutes of sonicating, the fluorinated film of Example 6 remained firmly intact, while the Teflon layer of the Spectrim™ had peeled away from the surface.

The fluorinated films of Example 6 were also heated up to 120° C. and cooled down. The films maintained the same spot size (2 mm for water and 3 mm for acetonitrile), as before the heating. Both the resistance to delimination and heating are desirable since it demonstrates that the films can be thoroughly washed and reused, reducing costs for the user since the available commercial substrates, which are not resistant to delamination and heating, can only be used once and then are discarded.

It is understood that the invention is not limited to the embodiments set forth herein for illustration, but embraces all such forms thereof as come within the scope of the following claims:

The invention claimed is:

1. A method for forming a fluorinated film on a surface, the method comprising:
    (a) depositing a fluorinated film comprising active sites on the surface by exposing the surface to a RF plasma in a chamber, the RF plasma comprising fluorine-containing molecular fragments generated from a gas comprising fluorinated hydrocarbon precursor molecules;
    (b) pumping down the chamber to remove the gas comprising fluorinated hydrocarbon precursor molecules; and
    (c) quenching the active sites by exposing the fluorinated film to a gas comprising fluorinated hydrocarbon quenching molecules in-situ, in the absence of plasma, wherein the fluorinated film comprises no more than about 3 atomic percent oxygen, and further wherein the pumping step occurs prior to the quenching step.

2. The method of claim 1, wherein the precursor molecules comprise hexafluoropropylene molecules.

3. The method of claim 1, wherein the precursor molecules comprise hexafluoropropylene oxide molecules.

4. The method of claim 1, wherein the fluorinated hydrocarbon quenching molecules comprise hexafluoropropylene molecules.

5. The method of claim 1, wherein the fluorinated hydrocarbon quenching molecules comprise hexafluoropropylene oxide molecules.

6. The method of claim 1, wherein the fluorinated hydrocarbon precursor molecules and the fluorinated hydrocarbon quenching molecules are independently selected from the group consisting of hexafluoropropylene molecules and hexafluoropropylene oxide molecules.

7. The method of claim 1, wherein the fluorinated film comprises at least about 55 atomic percent fluorine.

8. The method of claim 1, further wherein the pressure of the gas comprising fluorinated hydrocarbon precursor molecules is different from the pressure of the gas comprising fluorinated hydrocarbon quenching molecules.

9. The method of claim 1, wherein a water contact angle on the fluorinated film is at least about 110 degrees.

10. The method of claim 1, wherein the fluorinated film comprises at least about 55 atomic percent fluorine and further wherein a water contact angle on the fluorinated film is at least about 110 degrees.

11. The method of claim 1, wherein the C/F ratio of the fluorinated film is at least 0.7.

12. The method of claim 1, wherein the surface is the surface of a medical device.

13. The method of claim 12, wherein the medical device is a catheter guide wire.

14. The method of claim 1, wherein the surface comprises a metal, a glass or a polymer.

15. The method of claim 1, wherein the pressure of the gas comprising fluorinated hydrocarbon precursor molecules is higher than the pressure of the gas comprising fluorinated hydrocarbon quenching molecules.

16. The method of claim 1, wherein the fluorinated hydrocarbon precursor molecules are different from the fluorinated hydrocarbon quenching molecules.

17. The method of claim 1, wherein the fluorinated film comprises no more than about 2 atomic percent oxygen.

18. The method of claim 1, wherein a water contact angle on the fluorinated film is about 110 degrees to about 120 degrees.

19. The method of claim 18, wherein the water contact angle is about 115 degrees to about 120 degrees.

20. The method of claim 18, wherein the fluorinated film comprises at least about 55 atomic percent fluorine.

21. The method of claim 18, wherein the RF plasma is a continuous plasma.

22. The method of claim 1, wherein the RF plasma is a continuous plasma.

* * * * *